United States Patent [19]

Schweitzer, Jr.

[11] 4,424,512
[45] Jan. 3, 1984

[54] FAULT INDICATOR HAVING INCREASED SENSITIVITY TO FAULT CURRENTS

[76] Inventor: Edmund O. Schweitzer, Jr., 1002 Dundee Rd., Northbrook, Ill. 60118

[21] Appl. No.: 407,641

[22] Filed: Aug. 12, 1982

Related U.S. Application Data

[63] Continuation of Ser. No. 190,584, Sep. 25, 1980, abandoned.

[51] Int. Cl.³ .............................................. G08B 21/00
[52] U.S. Cl. ...................................... 340/664; 324/133
[58] Field of Search .............. 340/664, 659, 658, 654; 324/133, 51, 127; 361/74, 25, 100

[56] References Cited

U.S. PATENT DOCUMENTS

| | | | |
|---|---|---|---|
| 3,708,724 | 1/1973 | Schweitzer, Jr. | 324/133 X |
| 3,906,477 | 9/1975 | Schweitzer, Jr. | 324/133 X |
| 3,991,366 | 11/1976 | Schweitzer, Jr. | 324/133 X |
| 4,045,726 | 8/1977 | Schweitzer, Jr. | 324/133 X |
| 4,086,529 | 4/1978 | Schweitzer, Jr. | 324/133 X |
| 4,234,847 | 11/1980 | Schweitzer, Jr. | 324/133 X |

*Primary Examiner*—John W. Caldwell, Sr.
*Assistant Examiner*—Daniel Myer
*Attorney, Agent, or Firm*—Lockwood, Dewey, Alex & Cummings

[57] ABSTRACT

A fault indicator for indicating the occurrence of a fault current in an alternating current conductor includes a pair of parallel-spaced reed switches in magnetic communication with the conductor. The reed siwtches are electrically connected in parallel by a magnetically conductive bridging element at one end of the pair and by a non-magnetically conductive bridging element at the other end of the pair. A permanent magnet bridging the non-magnetic bridge establishes a magnetic bias circuit which extends serially through the switches to increase the sensitivity of each switch to a fault current during a respective half-cycle of the alternating current cycle.

14 Claims, 15 Drawing Figures

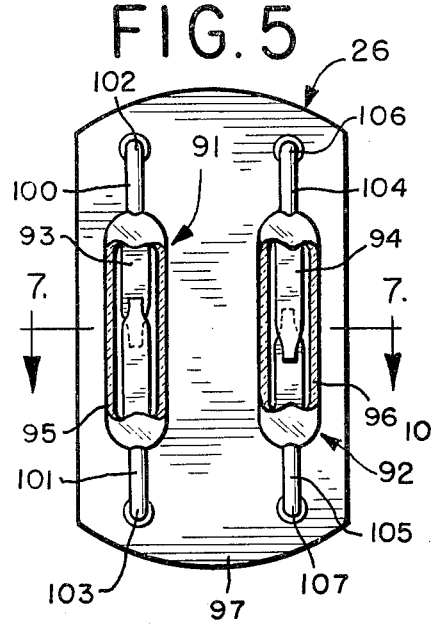
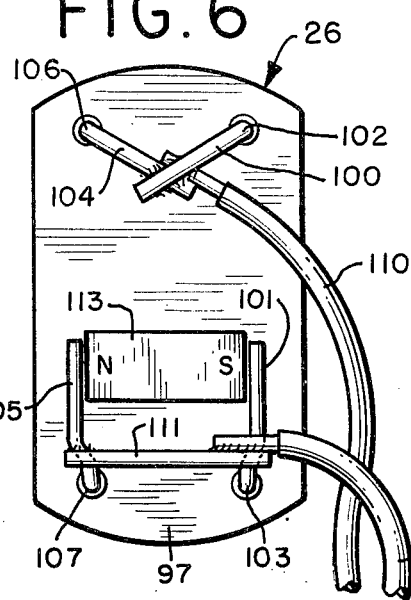
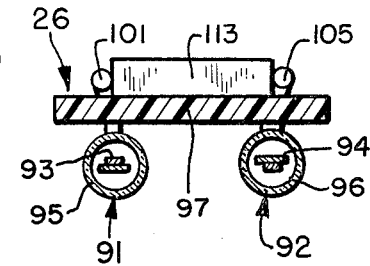
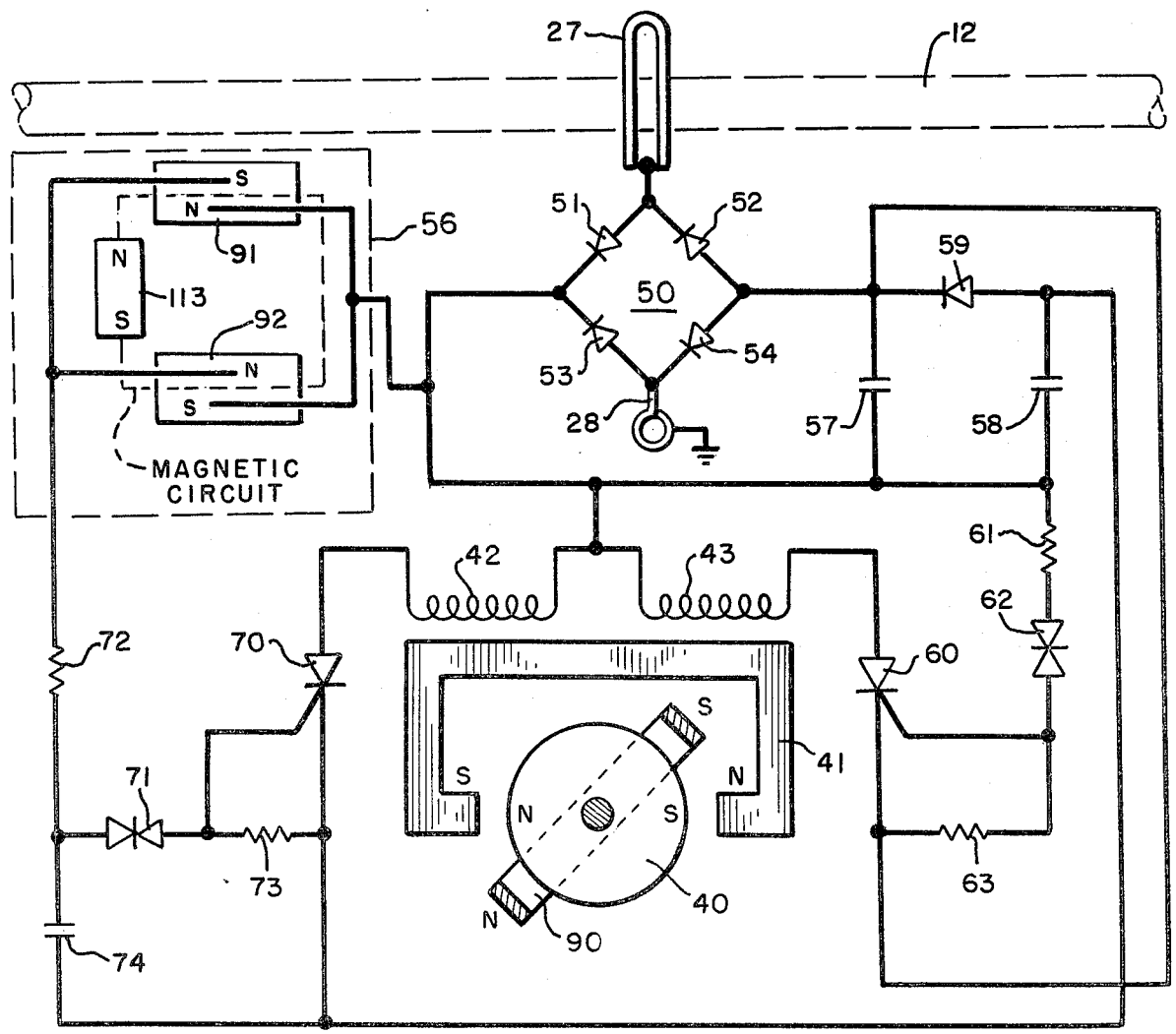
FIG. 8

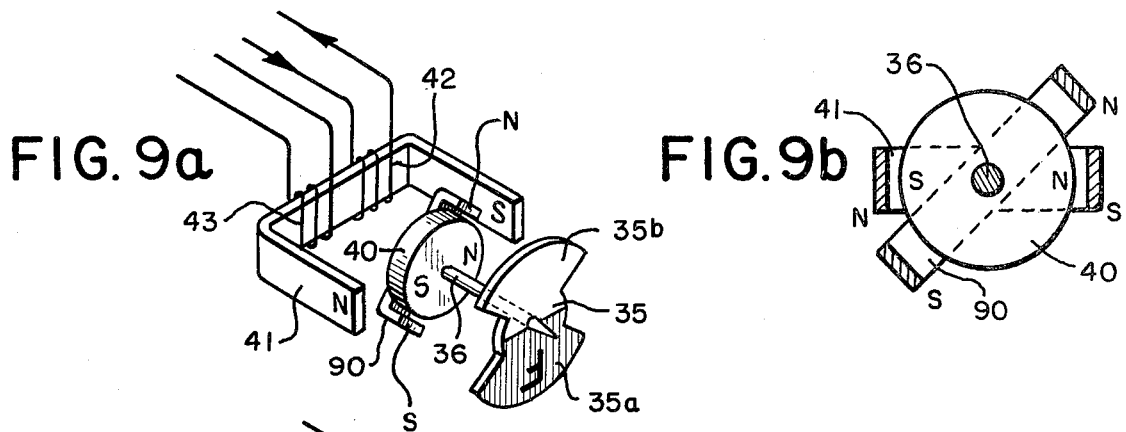
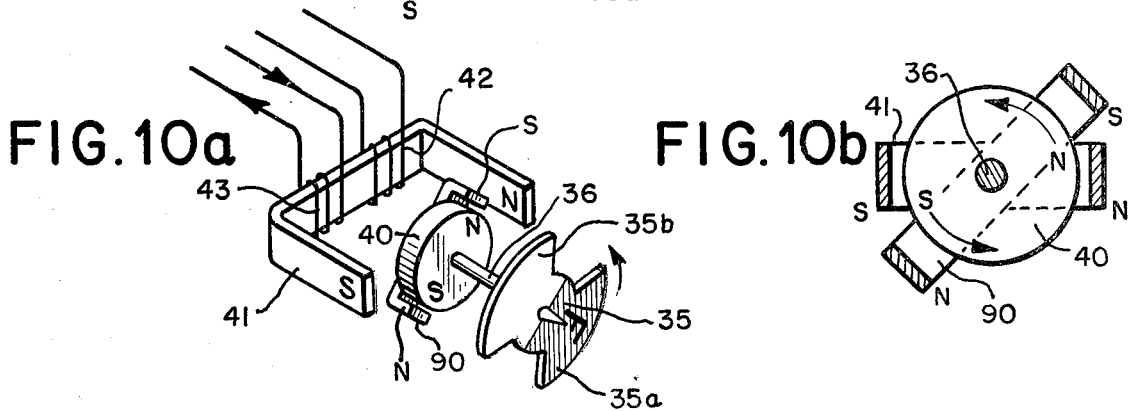
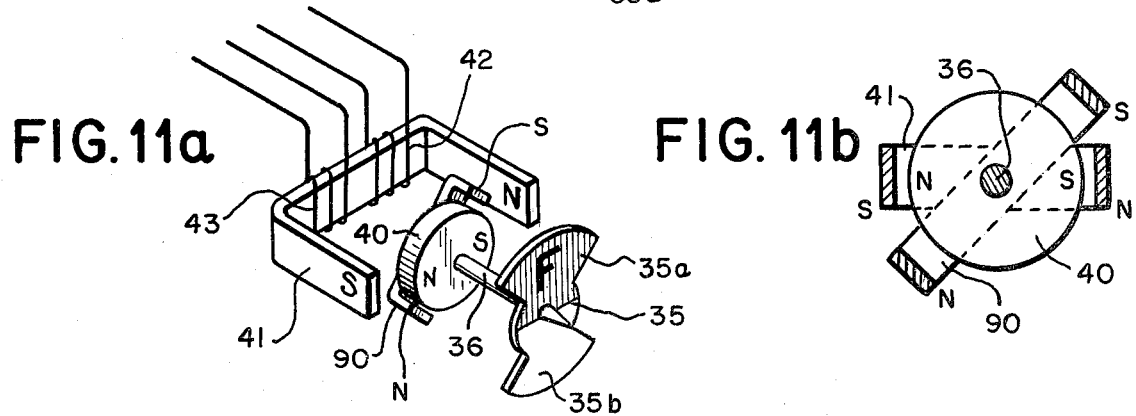
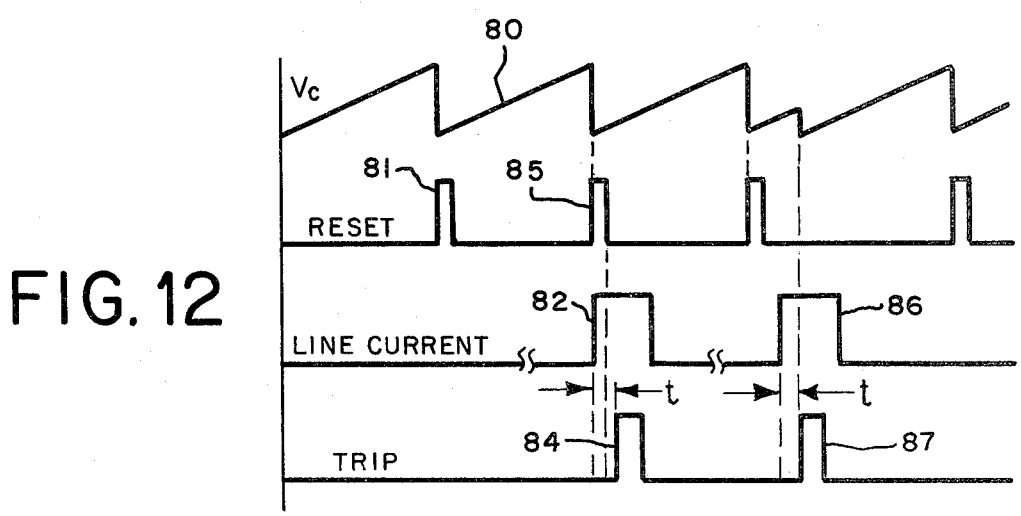

FAULT INDICATOR HAVING INCREASED SENSITIVITY TO FAULT CURRENTS

This is a continuation of application Ser. No. 190,584, filed Sept. 25, 1980, now abandoned.

BACKGROUND OF THE INVENTION

The present invention relates generally to current sensing devices for electrical systems, and more particularly to fault indicators for power distribution systems.

Various types of fault indicators have been constructed for detecting faults in an alternating current power distribution system, including clamp-on type fault indicators, which clamp directly over cables in the system, and testpoint type fault indicators, which are mounted over test points in the cables or associated connectors of the system. Such fault indicators may be either of the manually reset type, wherein it is necessary that the indicator be physically reset following each fault, or of the automatically reset type, wherein a fault indication is reset upon restoration of line current. Examples of such fault indicators are found in products manufactured by E. O. Schweitzer Mfg. Co. of Mundelein, Ill., and in U.S. Pat. Nos. 3,676,740, 3,906,477 and 4,063,171 of the present inventor.

Detection of fault currents by fault indicators is often most advantageously accomplished by means of a reed switch located within the indicator housing having contacts in close proximity to the conductor being monitored. Upon occurrence of an abnormally high fault-associated magnetic field around the conductor, the contacts of the reed switch close and actuate circuitry within the indicator which magnetizes an internal pole piece to position to a trip position a target indicator visible from the exterior of the indicator. Upon restoration of current in the conductor another circuit within the indicator may be actuated to reposition the target indicator to a reset non-fault indicating position.

Unfortunately, the maximum sensitivity attainable by such fault reed switch-actuated indicators has heretofore been limited in certain critical current monitoring applications by the sensitivity of the reed switch to an applied magnetic field. Mechanical and reliability considerations limit the contact structure of such switches so as to prevent obtaining the required low threshold level for contact closure. The present invention is directed to improvements in reed switch-actuated fault indicators which provide for improved sensitivity to fault currents. Specifically, the present invention provides for a magnetically biased reed switch assembly in the fault indicator which enables the indicator to reliably respond to lower fault currents in either the positive or negative half-cycles of a monitored alternating current conductor.

Accordingly, it is a general object of the present invention to provide a new and improved fault indicator for a power distribution system.

It is a more specific object of the present invention to provide a new and improved fault indicator for an alternating current power distribution system having improved sensitivity to fault currents occurring in the system.

SUMMARY OF THE INVENTION

The invention is directed to a fault indicator for indicating the occurrence of a fault current in excess of a predetermined threshold level in an electrical conductor. The indicator includes a housing adapted for mounting in proximity to the conductor, and status indicating means having a reset-indicating state and a fault-indicating state. Trip circuit means are provided for conditioning the status indicating means to the fault-indicating state in response to an applied control effect. Fault detecting means including a reed switch in magnetic communication with the conductor and responsive to occurrence of a fault current in excess of the threshold level provide a control effect to the trip circuit means. Magnetic circuit means including a permanent bias magnet establish a magnetic field across the reed switch to increase the sensitivity thereof below the predetermined threshold level to render the indicator responsive to the fault current.

BRIEF DESCRIPTION OF THE DRAWINGS

The features of the present invention, which are believed to be novel, are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 5 is an enlarged front elevational view of the reed switch assembly of the fault indicator.

FIG. 6 is an enlarged rear elevational view of the reed switch assembly of FIG. 5.

FIG. 7 is a cross-sectional view of the reed switch assembly taken along line 7—7 in FIG. 5.

FIG. 8 is an electrical schematic diagram of the fault indicator.

FIGS. 9a and 9b are diagrammatic view of the principal components of the fault indicator in a reset state.

FIGS. 10a and 10b are diagrammatic views similar to FIGS. 9a and 9b, respectively, showing the principal components of the fault indicator in transition between a reset state and a tripped state.

FIGS. 11a and 11b are diagrammatic views similar to FIGS. 9a and 9b, respectively, showing the principal components of the fault indicator in a tripped state.

FIG. 12 is a graphical depiction of certain time, voltage and current relationships within the fault indicator circuitry useful in understanding the operation of the fault indicator.

DESCRIPTION OF THE PREFERRED EMBODIMENT

Figure 1:
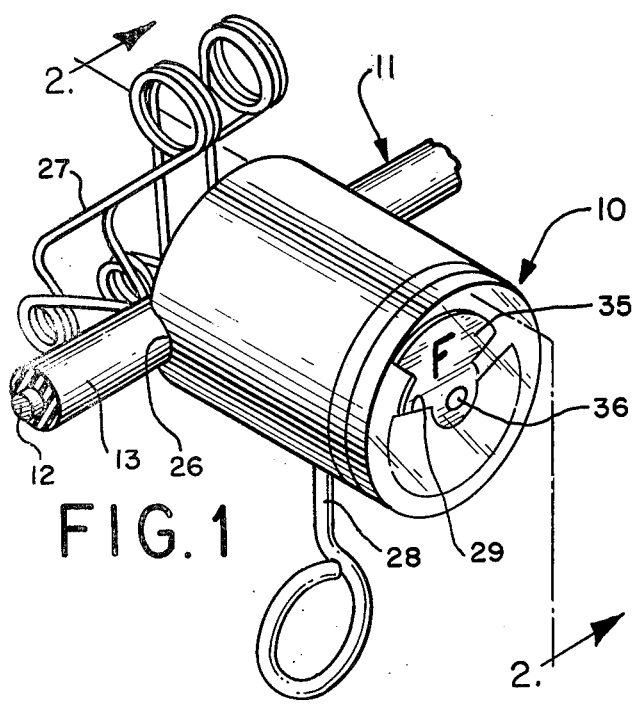
FIG. 1 is a perspective view of a resettable conductor-mounted fault indicator constructed in accordance with the present invention.

Referring to the drawings, and particularly to FIGS. 1-4, a fault indicator 10 constructed in accordance with the invention is shown in conjunction with a conventional insulated cable 11 of the type commonly used in high voltage alternating current power distribution systems. As shown, cable 11 includes generally an axial conductor 12 formed of an appropriate electrically conductive metal such as copper and an insulating jacket 13.

The fault indicator 10 comprises a cylindrical transparent plastic housing 21 within which the electrical components of the fault indicator circuit are contained. The cylindrical housing 21 is open at one end, and includes an integral partition 24 which serves a mask and spacing element, and a transparent end cap portion 25 which is sonically welded to the closed end of the housing.

When fault indicator 10 is installed on cable 13 the cable is received within two semi-annular recesses 26 on the open-end rim of housing 21. A clamp element 27 extends to the opposite side of the cable and biases the cable in the recesses to hold the fault indicator securely in position. In the illustrated embodiment clamp element 27 is in the form of an appropriately formed and coiled spring wire which also serves to establish a capacitive coupling circuit to conductor 12. However, it will be appreciated that other forms of clamping, such as a spring-biased lever pivotally attached to housing 21, could be used as well.

Figure 2:
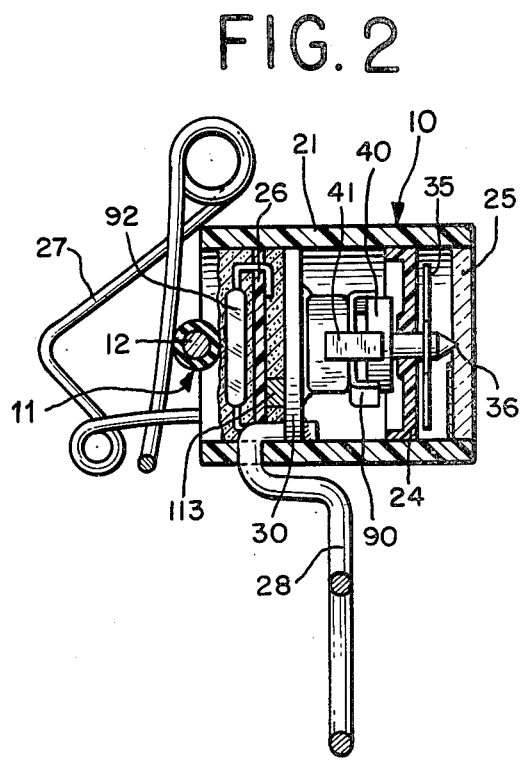
FIG. 2 is a cross-sectional view of the fault indicator taken along line 2—2 in FIG. 1.

To facilitate installation and removal from cable 11, the fault indicator includes a downwardly projecting handle portion 28 by which the indicator can be positioned. As best seen in FIGS. 1 and 2, in the illustrated embodiment this handle portion is formed by a stiff wire looped at the end to facilitate engagement by a conventional lineman's tool. However, it will be appreciated that the handle portion may be formed from other elements as well, such as a stamped metal bracket.

Figure 3:
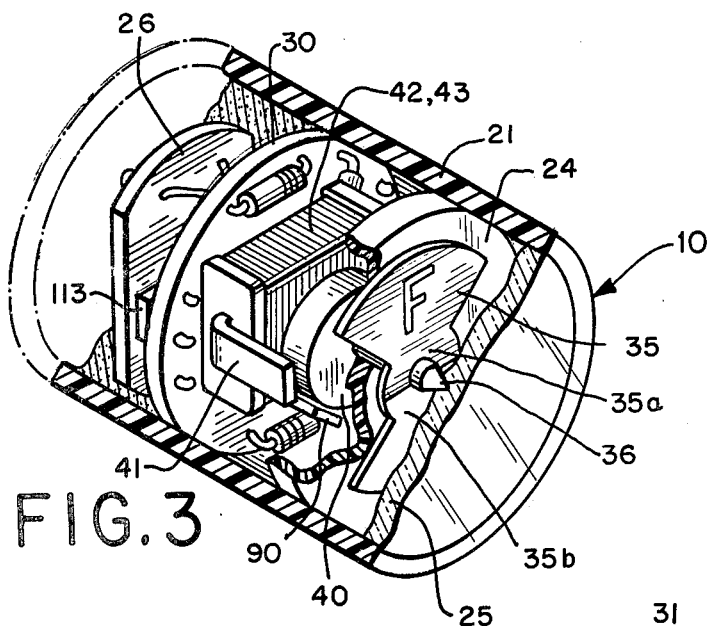
FIG. 3 is an enlarged front perspective view of the fault indicator partially broken away to show principal components thereof.
Figure 4:
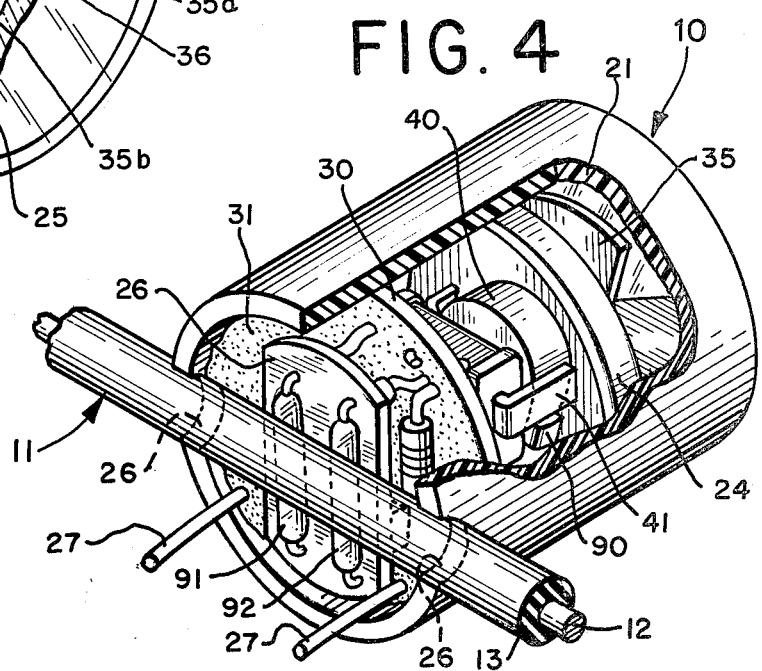
FIG. 4 is an enlarged rear perspective view of the fault indicator partially broken away to show principal components thereof.

Referring to FIGS. 2-4, a disc-shaped insulator board 30 is positioned within housing 21 perpendicular to the axis of the housing. The insulator board, which may after assembly be secured in position in the housing by an epoxy material 31 filling the housing, serves as mounting means for principal electrical components of the fault indicator. A capacitive coupling circuit is established between certain of these components and conductor 12 by means of the spring clamp 27, the ends of the spring clamp extending through the circuit board and being connected to components on the circuit board. An electrical ground is established to the circuit board by handle portion 28, which as seen in FIG. 2, is also electrically connected to certain components on insulator board 30.

To provide an indication of the occurrence of a fault current in conductor 12, the fault indicator includes within the lower end of housing 21 a disc-shaped target 35 which is mounted for rotation on a pivot 36. The face of the target disc has a red segment 35a and a white segment 35b, only one of which is visible at a time through a window 29 formed at the transparent end of housing 21.

Secured to and pivotal with target 35 is a target permanent magnet 40 which is formed of a magnetic material having a high coercive force, such as ceramic, and is magnetically polarized to form two magnetic poles of opposite gender, as indicated in FIGS. 9-11, with opposite magnetic polarities along a diameter of the magnet. The target disc 35 and its permanent magnet 40 are biased to the position shown in FIGS. 9a and 9b when the fault indicator is in a non-tripped or reset condition by means of a stationary generally U-shaped magnetic pole piece 41 which is located within housing 21 generally co-planar with the axis of rotation of target disc 35.

The pole piece 41, which is preferably formed of a magnetic material having a relatively low coercive force, such as a chrome steel, is biased at its projecting ends to the magnetic polarities indicated in FIG. 7. As shown in FIGS. 3 and 5, the ends of the pole piece extend along the side wall of housing 21, in close proximity to target magnet 40. As a result, the opposite polarity magnetic poles of the target magnet 40 are attracted to position the target disc 35 as shown. In this position the red segment 35a of the target disc is not visible through window 29, and all that is seen is the white segment 35b.

On the occurrence of a fault current in conductor 12, which may, for example, exceed 400 amperes, pole piece 41 is remagnetized to the magnetic polarities shown in FIGS. 10 and 11 by momentary energization of a trip winding 42 on the center section of the pole piece. As a result, the poles of magnet 40 are repelled by the adjacent like gender poles of the pole piece and the target disc is caused to rotate 180° to the tripped position shown in FIGS. 11a and 11b. In this position, the red segment 35b of the target disc is visible through window 29, and a lineman viewing the fault indicator is advised that a fault current has occurred in conductor 12.

The target disc remains in the fault indicating position until the ends of pole piece 41 are subsequently re-magnetized to the magnetic polarities shown in FIG. 9 by momentary energization of a reset winding 43 on the center section of the pole piece. As a result, the target magnet 40, and hence the target disc 35, are caused to rotate from the tripped position shown in FIG. 11 to the reset position shown in FIG. 9, and the fault indicator is conditioned to respond to a subsequent fault current.

Energization of trip winding 42 upon occurrence of a fault current in conductor 12, and energization of reset winding 43 upon restoration of current in conductor 12 following a fault, is accomplished by means of externally powered circuitry contained within the fault indicator. Referring to the schematic diagram shown in FIG. 8, windings 42 and 43 are connected end-to-end for independent energization upon occurrence of fault and reset conditions, respectively. Operating power for these windings is obtained by means of a bridge rectifier network 50, consisting of diodes 51-54. One input terminal of this network, formed at the juncture of the anode of diode 51 and the cathode of diode 52, is capacitively coupled through clamp 27 to the monitored conductor 12. The other input terminal, formed at the anode of diode 53 and the cathode of diode 54, is capacitively coupled to ground through the electrically conductive handle portion 28 of the fault indicator. With this arrangement, high voltage alternating current carried in conductor 12, which in practice exceeds 5000 volts, is capacitively coupled to the input terminals of bridge rectifier network, resulting in the production of a pulsating unidirectional current at the output terminals of the network sufficient to drive the circuitry of the fault indicator.

The positive polarity output terminal of the bridge rectifier network, formed at the cathodes of diodes 51 and 53, is connected to current sensing means in the form of a reed switch assembly 56, to the end terminals of windings 42 and 43, and to respective terminals of a pair of capacitors 57 and 58. The negative polarity output terminal of the bridge rectifier network, formed at the juncture of the anodes of diodes 52 and 54, is connected directly to the remaining terminal of capacitor 57, and through a forward-biased diode 59 to the remaining terminal of capacitor 58. With this arrangement, capacitors 57 and 58 are charged by the pulsating unidirectional current developed by bridge rectifier network 50 during normal current flow in conductor 12.

To provide for periodic energization of reset winding 43 during normal current flow-in conductor 11, the remaining end terminal of winding 43 is connected through a silicon controlled rectifier (SCR) 60 to the negative polarity terminal of capacitor 57. Periodic conduction through SCR 60 is obtained by connecting the gate electrode of that device to the positive polarity output terminal of bridge rectifier network 50 through a resistor 61 and a bilateral diode 62, and to the cathode of SCR 60 by a resistor 63. With this arrangement, SCR 60 is periodically triggered into conduction when the voltage developed across bilateral diode 62 as a result of capacitor 57 being charged by bridge rectifier 50 reaches the threshold level of the bilateral diode.

In operation, under normal current flow conditions, the voltage developed across capacitor 57 as the capacitor is charged by bridge rectifier network 50 progressively increases with time, until the threshold breakdown voltage of bilateral diode 62 is reached, at which time SCR 60 is triggered and capacitor 57 discharges through winding 43. Diode 59 prevents capacitor 58 from being discharged through SCR 60 and winding 43, leaving the capacitor available for energizing winding 43 in response to a fault condition. In practice, the breakdown voltage of bilateral diode 62 may be in the order of 34 volts, and the time required for capacitor 58 to reach this threshold level with a voltage level of 4,400 volts on conductor 12 may be approximately two minutes. In any case, the voltage level within conductor 12 is not critical to the operation of the reset circuit, and has only the effect of changing the frequency of the reset cycle.

Trip winding 43 is energized upon occurrence of a fault current in conductor 12 by discharge of capacitor 58 through a second silicon controlled rectifier (SCR) 70. Conduction is established through SCR 70 by closure of contacts in reed switch assembly 56, which is positioned within housing 21 in close proximity to conductor 12 such that the contacts are closed by the magnetic field produced in the vicinity of conductor 12 upon occurrence of a fault current. The gate electrode of SCR 70 is connected through a bilateral diode 71 and a resistor 72 to the contacts of reed switch assembly 56, and by a resistor 73 to the SCR cathode. The juncture of resistor and bilateral diode 71 is connected by a capacitor 74 to capacitor 58.

Upon occurrence of a fault current in conductor 12, the positive polarity output terminal of bridge rectifier network 50 is connected through the closed contacts of reed switch assembly 56 and the circuit comprising resistor 72, bilateral diode 71, resistor 73 and capacitor 74 to the gate electrode of SCR 70, causing that device to be rendered conductive following a predetermined time delay. At this time capacitors 57 and 58 are caused to discharge through SCR 70 and energize winding 42. The resulting magnetic flux in the U-shaped pole piece 41 reverses the magnetic pole polarities of the pole piece and causes rotation of the target as previously described.

To preclude the possibility of windings 42 and 43 being simultaneously actuated by simultaneous conduction through SCR 70 and SCR 60, resistor 72 and capacitor 74 form an RC time delay circuit in the gate circuit of SCR 70 which provides a predetermined time delay in conduction through SCR 70 following occurrence of a fault current in conductor 12. Upon closure of the contacts of reed switch assembly 56 it is necessary that capacitor 74 charge through resistor 72 to the threshold voltage of bilateral diode 71 before sufficient gate electrode current is supplied to SCR 70 to initiate conduction in that device. The actual time delay provided is determined by the resistance of resistor 72, the capacitance of capacitor 74, the threshold voltage of bilateral diode 71, and the voltage level developed means capacitor 58, and is designed to insure that should a fault occur simultaneously with the periodic energization of winding 43, capacitor 57 will have completely discharged through that winding prior to winding 42 being energized to signal the fault.

The time delay relationship can be seen by referring to the waveforms illustrated in FIG. 12. Under normal line current conditions it is seen that the voltage Vc developed across capacitor 57 and depicted by waveform 80 progressively increases until the threshold level of bilateral diode 62 is reached, at which time SCR 60 is rendered conductive and a reset current depicted by waveform 81 is repetitively caused to flow through reset winding 43.

Upon occurrence of a fault current in conductor 12, as depicted by waveform 82, trip winding 42 is energized after a delay interval t, as shown by waveform 84. Should the fault current occur simultaneously with a reset pulse, as shown by waveforms 81 and 82, capacitor 57 will have completely discharged through winding 43 prior to winding 42 being energized as a result of the time delay period t. If it were not for this delay period, windings 42 and 43 would be simultaneously energized, resulting in the production of opposing magnetic fields in pole piece 41 and raising the possibility of rotor 35 not responding to the fault. Typically, the reset current pulses applied to windings 42 and 43 have a duration of approximately 20 microseconds, and fault currents existing in conductor 12 have a duration of one quarter cycle, or approximately four milliseconds in a 60 hertz system.

Should a fault occur before the reset pulse, as illustrated by waveform 86, the then occurring reset cycle will be interrupted by discharge of capacitor 57 through diode 59 and SCR 70 so that no possibility exists of a reset pulse occurring simultaneously with the ensuing delayed trip pulse 87. Upon discharge of capacitors 57 and 58 through winding 42, the reset cycle begins anew as SCR 70 again becomes non-conductive.

To avoid any possibility of rotor 35 becoming stalled upon reversal of the magnetic polarities of pole piece 41, as might happen with a rotor being perfectly centered between the poles of pole pieces 41 and having a degree of bearing friction, the fault indicator includes an auxiliary U-shaped pole piece 90 positioned adjacent target magnet 40 coaxial with and at an angle to pole piece 41. In operation, the magnetic field between the poles of pole piece 41 results in the production of induced magnetic poles on auxiliary pole piece 90 of opposite gender to the most adjacent poles of pole piece 41. As a result, upon reversal of the gender of the poles of pole piece 50 following occurrence of a fault current the auxiliary poles exert a rotational force on the most adjacent poles of the permanent rotor magnet 40 associated with target 35. This results in a rotational moment being exerted on the target, tending to turn the target in a predetermined (counterclockwise in FIGS. 9–12) direction such that the target is precluded from remaining in its reset position, even if it should be perfectly positioned and have a degree of bearing friction. Once rotation has been established, as shown in FIGS. 10a and 10b, the greater force of the main pole piece 41 overcomes the effect of the auxiliary pole piece 90 and rotation continues until the target is aligned as shown in FIGS. 11a and 11b.

In accordance with the invention, fault indicator 10 incorporates sensing means in the form of a reed switch assembly 26 which renders the fault indicator responsive to fault currents below the current level ordinarily required to actuate a magnetic-reed switch. Referring to FIGS. 5-7, reed switch assembly 26 is seen to comprise a first magnetic reed switch 91 and a second magnetic reed switch 92, each being conventional in construction and including respective axially-extending contact pairs 93 and 94 within respective hermetically sealed cylindrical housings 95 and 96. The two reed switches are mounted in parallel-spaced relationship on one side of an electrically non-conductive mounting board 97, which is in turn mounted within housing 21 in parallel-spaced relationship to circuit board 30.

Magnetic reed switch 91 includes a pair of axially-projecting leads 100 and 101 which extend through respective apertures 102 and 103 to the opposite side of mounting board 97. Similarly, magnetic reed switch 92 includes a pair of axially-projecting leads 104 and 105 which extend through respective apertures 106 and 107 to the opposite side of the mounting board. On the opposite side, leads 100 and 104 are joined to each other, and to a connecting lead 110, by a solder connection or other appropriate means. The leads of the switch devices being magnetically and electrically conductive, this in effect forms an electrically conductive bridging element of high permeability and low coercivity between the two adjacent ends of the devices.

Leads 101 and 105 are folded back in parallel-spaced relationship and are electrically connected to each other adjacent to apertures 103 and 107 by a non-magnetically conductive bridge element 111. In addition, bridge element 111 and lead 105 may be connected to a connecting lead 112 by a solder connection or other appropriate means.

To enable magnetic reed switches 91 and 92 to close in response to applied magnetic fields which would not otherwise be sufficient to close the switches, reed switch assembly 26 includes magnetic biasing means in the form of a permanent magnet 113 mounted to mounting board 97 between the parallel-spaced ends of leads 101 and 105. This magnet forms, in conjunction with the magnetically conductive reed switch leads 100, 101, 104 and 105 a magnetic circuit which serially includes contact pairs 93 and 94 of the reed switches. As a result, magnetic poles of opposite gender are induced between the open contacts of each pair, creating an attraction force not sufficient to close the contacts but nevertheless tending to bias the contacts into engagement. This bias allows the contacts to close in response to a lower-level applied magnetic field, thereby making the fault indicator more sensitive to fault currents.

To establish the required magnetic circuit it is necessary that bridging member 111 be non-magnetically conductive to prevent permanent magnet 113 from being magnetically short-circuited. In practice, this member may be formed of copper or brass to provide the necessary degree of electrical conductivity.

Referring to FIG. 8, it should be noted that that magnetic poles established across open contact pairs 93 and 94 are of opposite magnetic gender. With the reed switches aligned side-by-side as shown, this allows the reed switch assembly, and hence the fault indicator, to respond to fault currents occurring in either the positive or negative half-cycles of the alternating current cycle. Furthermore, since the same magnet is utilized to bias both reed switches, with identical reed switches a high degree of uniformity in response levels is obtained between the two half-cycles.

In practice, the magnetic bias arrangement of the present invention has enabled fault currents as low as 10 amperes to be indicated. Without the bias circuit, limitations on available and practical reed switches made it possible to reliably detect fault only as low as approximately 25 amperes.

Since the magnetic reed switch assembly utilizes only a single permanent magnet and two conventional reed switches, it is compact and economical to produce, and can be readily incorporated in existing fault indicator designs.

Thus, a self-resetting fault indicator has been described which incorporates a novel magnetic reed switch assembly for improved sensitivity. While this reed switch assembly has been shown in a fault indicator of the type intended for clamp-on mounting on an electrical cable, it will be appreciated that it can be incorporated in other types of fault indicators as well, such as those intended for mounting on an elbow type connector, and those intended for direct connection to an external source of excitation. In fact, the improvements incorporated in the illustrated fault indicator can be incorporated in any type of magnetic field-responsive fault indicator which utilizes electrical trip circuitry.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fault indicator responsive to the occurrence of a fault current at or above a predetermined minimum threshold level in an alternating current conductor, comprising, in combination:

a housing including means for attaching the housing to the conductor;

indicator means within said housing having a reset-indicating state and a fault-indicating state;

electric circuit means within said housing for conditioning said indicator means to said fault-indicating state in response to a contact closure;

first and second magnetic reed switch elements arranged in parallel-spaced relationship to respective parallel-spaced planes each generally perpendicular to the axis of said conductor, said switch elements being in magnetic communication with said conductor and each including a pair of contacts actuated only upon the occurrence of a current in said conductor in excess of said predetermined threshold level;

said magnetic reed switch elements each including an elongated housing having magnetically and electrically conductive wire leads extending from the ends thereof;

the lead on one end of said first switch elements being electrically and magnetically connected to the lead on the adjacent end of said second switch elements, the remaining leads of said switch elements being arranged in parallel-spaced relationship to each other and to the axis of said switch elements;

a magnetically non-conductive and electrically conductive bridging element connected between said parallel-spaced switch leads, said circuit means being connected to said bridging element and to said connected leads whereby said indicator means are conditioned to a fault indicating state upon closure of either of said contacts of said switch elements; and permanent magnet means mounted with the opposing poles thereof in communication with respective ones of said parallel spaced leads for establishing a magnetic bias circuit which serially includes said contacts of said magnetic switch elements, whereby said switch elements actuate upon the occurrence of a fault current at or above said threshold level during respective half cycles of the alternating current in the conductor, and return to a non-actuated state following termination of the fault current.

2. A fault indicator as defined in claim 1 wherein said bridging element is formed from a group of materials consisting of copper and brass.

3. A fault indicator as defined in claim 1 including a circuit board arranged within said housing generally perpendicular to a radius of said conductor, said magnetic reed switch elements being arranged on one side of said circuit board with said leads extending through apertures therein, and remaining leads being folded back on the opposite side of said board, and said bridging element and said permanent magnet being mounted on said opposite side of said board.

4. A fault indicator responsive to the occurrence of a fault current at or above a predetermined minimum threshold level in an alternating current conductor, comprising, in combination:

a housing including means for attaching the housing to the conductor;

indicator means within said housing having a reset-indicating state and a fault-indicating state;

electric circuit means within said housing for conditioning said indicator means to said fault-indicating state in response to a contact closure;

a circuit board arranged within said housing generally perpendicular to a radius of said conductor;

first and second magnetic reed switch elements arranged in parallel-spaced relationship on one side of said circuit board in respective parallel-spaced planes each generally perpendicular to the axis of said conductor, said switch elements being in magnetic communication with said conductor and each including a pair of contacts actuated only upon the occurrence of a fault current in said conductor in excess of said predetermined threshold level;

said magnetic reed switch elements each including an elongated housing having magnetically and electrically conductive wire leads extending from the ends thereof;

said leads of said reed switch elements passing through respective apertures in said circuit board to the opposite side thereof, the lead on one end of said first switch element being electrically and magnetically connected to the lead on the adjacent ends of said second switch element, the remaining leads of said switch elements being each folded back along the rear surface of said circuit board in parallel-spaced relationship to each other and to the axis of said switch elements;

a magnetically non-conductive and electrically conductive bridging elements connected between said parallel spaced switch leads, said circuit means being connected to said bridging element and to said connected leads whereby said indicator means are conditioned to a fault indicating state upon closure of either of said contacts of said switch elements; and permanent magnet means mounted to the underside of said circuit board with the opposing poles thereof in communication with respective ones of said parallel-spaced leads for establishing a magnetic bias circuit which serially includes said contacts of said magnetic switch elements, whereby said switch elements are actuated upon the occurrence of a fault current at or above said threshold level during respective half cycles of the alternating current in the conductor and revert to a non-actuated state upon termination of the fault current.

5. A fault indicator responsive to the occurrence of a fault current at or above a predetermined minimum threshold level in an associated alternating current conductor, comprising, in combination:

a housing;

indicator means within said housing having a fault-indicating state and a reset-indicating state;

electric circuit means including first and second magnetic switch elements in magnetic communication with said conductor and in parallel circuit configuration for conditioning said indicating means to said fault-indicating state upon actuation of either switch element, said switch elements actuating only in response to occurrence of a current in the conductor greater than the predetermined threshold level; and magnetic circuit means including a permanent magnet for establishing a magnetic bias circuit serially including said magnetic switch elements whereby said switch elements actuate upon the occurrence of a fault current at or above said threshold level during respective half cycles of the alternating current in the conductor, and return to a non-actuated state following termination of the fault current.

6. A fault indicator as defined in claim 5 wherein said magnetic switch elements are magnetic reed switches.

7. A fault indicator as defined in claim 6 wherein said first and second magnetic switch elements are arranged generally in parallel-spaced configuration in respective planes perpendicular to the axis of the conductor and in a common plane perpendicular to a radius of the conductor.

8. A fault indicator as defined in claim 7 wherein one end of said first magnetic switch element is connected to one end of said second magnetic switch element by a magnetically and electrically conductive bridge element, and the other end of said first magnetic switch element is connected to the other end of said second magnetic switch element by a non-magnetically conductive electrically-conductive bridge element, and said permanent bias magnet is positioned in magnetic communication with said other ends of said switch elements.

9. A fault indicator responsive to the occurrence of a fault current in an associated alternating current conductor at or above a predetermined minimum threshold level, comprising, in combination:

a housing;

indicator means within said housing having a reset-indicating state and a fault-indicating state;

circuit means including first and second magnetic switch elements in magnetic communication with said conductor and each actuated only upon the occurrence of a current in the conductor in excess of said predetermined threshold level for conditioning said indicating means to said fault indicating state, said switch elements being generally arranged in a parallel-spaced configuration in respective planes; and magnetic circuit means including an electrically magnetically conducting bridging means between adjacent ends of said switch elements, magnetically non-conductive and electrically conductive bridging means across the other adjacent ends of said switch elements, and permanent magnet means for inducing a magnetic field between said other adjacent ends, for establishing a magnetic bias circuit serially including said magnetic switch elements, whereby said switch elements actuate upon the occurrence of a fault current at said threshold level during respective half cycles of the alternating current in the conductor, and return to a non-actuated state upon termination of the fault current.

10. A fault indicator as defined in claim 9 wherein said magnetic switch elements are magnetic reed switches.

11. A magnetic switch assembly responsive to the occurrence of a fault current in an associated alternating current conductor at or above a predetermined minimum threshold level, comprising, in combination:

means including first and second magnetic switch elements in magnetic communications with the conductor and operable only upon the occurrence of a current in the conductor in excess of said predetermined threshold level; and magnetic circuit means including a permanent magnet for establishing a magnetic bias circuit serially including said magnetic switch elements whereby said switch elements actuate upon the occurrence of a fault current at said threshold level during respective half-cycles in the conductor, and return to a non-actuated state following termination of the fault current.

12. A magnetic switch assembly as defined in claim 11 wherein said magnetic switch elements are magnetic reed switches.

13. A magnetic switch assembly responsive to the occurrence of a fault current in an alternating current conductor at or above a predetermined minimum threshold level, comprising, in combination:

circuit means including first and second magnetic switch elements in magnetic communication with said conductor and each actuated only upon the occurrence of a current in the conductor in excess of said predetermined threshold level for conditioning said indicating means to said fault-indicating state, said switch elements being arranged in a parallel-spaced configuration; and magnetic circuit means including an electrically and magnetically conducting bridging means between adjacent ends of said switch elements, magnetically non-conductive and electrically conductive bridging means across the other adjacent ends of said switch elements, and permanent magnet means for inducing a magnetic field between said other adjacent ends, for establishing a magnetic bias circuit serially including said magnetic switch elements whereby said switch elements actuate upon the occurrence of a fault current at said threshold level during respective half cycles of the alternating current in the conductor, and return to a non-actuated state following termination of the fault currènt.

14. A magnetic switch assembly as defined in claim 13 wherein said magnetic switch elements are magnetic reed switches.

* * * * *